(12) United States Patent
Gu

(10) Patent No.: US 11,860,073 B2
(45) Date of Patent: Jan. 2, 2024

(54) WAFER BREAKING METHOD AND CHIP FAILURE ANALYSIS METHOD

(71) Applicant: CHANGXIN MEMORY TECHNOLOGIES, INC., Hefei (CN)

(72) Inventor: Wen-Lon Gu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 94 days.

(21) Appl. No.: 17/660,470

(22) Filed: Apr. 25, 2022

(65) Prior Publication Data

US 2023/0147284 A1 May 11, 2023

(30) Foreign Application Priority Data

Nov. 8, 2021 (CN) .......................... 202111312232.7

(51) Int. Cl.
*G01N 19/08* (2006.01)
*G01N 1/28* (2006.01)

(52) U.S. Cl.
CPC ............. *G01N 1/286* (2013.01); *G01N 19/08* (2013.01); *G01N 2001/2886* (2013.01)

(58) Field of Classification Search
CPC . G01N 1/286; G01N 19/08; G01N 2001/2886
See application file for complete search history.

(56) References Cited

FOREIGN PATENT DOCUMENTS

| CN | 111799220 A | * 10/2020 |
| CN | 111799220 A | 10/2020 |

* cited by examiner

*Primary Examiner* — Jamel E Williams
(74) *Attorney, Agent, or Firm* — Cooper Legal Group, LLC

(57) ABSTRACT

Embodiments of the present disclosure relate to a wafer breaking method and a chip failure analysis method. The wafer breaking method includes: providing a wafer sample, which includes a first surface with a target point and a second surface opposite to the first surface; forming a first crack and a second crack, orthographic projection of which on the first surface are on the same straight line as the target point in a preset direction; forming a cutting slot, there is a preset distance between a bottom of the cutting slot and the first surface, and orthographic projection of the first crack and the second crack are on the same straight line as the cutting slot; and breaking the wafer sample along the cutting slot, such that the wafer sample is broken in the preset direction to obtain a cross section of the target point in the preset direction.

13 Claims, 4 Drawing Sheets

WAFER BREAKING METHOD AND CHIP FAILURE ANALYSIS METHOD

CROSS-REFERENCE TO RELATED APPLICATION

This disclosure claims the priority of Chinese Patent Application No. 202111312232.7 submitted to the Chinese Intellectual Property Office on Nov. 8, 2021, the disclosure of which is incorporated herein in its entirety by reference.

TECHNICAL FIELD

Embodiments of the present disclosure relate to the field of integrated circuit (IC) manufacturing, and in particular to a wafer breaking method and a chip failure analysis method.

BACKGROUND

In process development and failure analysis of semiconductors, it is usually necessary to analyze the cross-sectional topography of a specific pattern on a wafer. The wafer is a single-crystal structure with atoms arranged in neat rows. In a typical wafer breaking approach, the surface of a wafer edge near a target is slightly scratched with a diamond/tungsten carbide tipped scriber, and then the wafer is broken directly with both hands. The breakage plane of the wafer is naturally and neatly broken along the crystal direction (preferred breakage direction) of the wafer. The wafer notch is perpendicular or parallel to the product line direction on the wafer. Typically, the product line direction is parallel or perpendicular to the crystal direction of the wafer. The breakage plane generated by natural breaking is parallel or perpendicular to the preferred breakage direction of the wafer, and the physical properties of the wafer can be microscopically analyzed by directly observing the breakage plane.

However, for some wafer, due to characteristic requirements, the product line direction may have a preset angle greater than 0° and less than 90° with the crystal direction, and the breakage plane generated by natural breaking may also have a preset angle with the crystal direction. In this case, the microscopic analysis of the physical properties of the wafer cannot be performed by directly observing the breakage plane. Therefore, it is an urgent problem to make the breakage plane of the wafer always perpendicular or parallel to the product line direction.

SUMMARY

The wafer breaking method includes:
providing a wafer sample, where the wafer sample includes a first surface with a target point and a second surface opposite to the first surface;
forming a first crack and a second crack respectively at edges of the wafer sample, where orthographic projection of the first crack and the second crack on the first surface are on the same straight line as the target point in a preset direction;
forming a cutting slot in the preset direction on the second surface, where there is a preset distance between a bottom of the cutting slot and the first surface, and orthographic projection of the first crack and the second crack on the second surface are on the same straight line as the cutting slot; and
breaking the wafer sample along the cutting slot, such that the wafer sample is broken in the preset direction, so as to obtain a cross section of the target point in the preset direction.

A chip failure analysis method includes:
taking an abnormal chip region as a target point, and obtaining a cross section of the abnormal chip region in a preset direction by the wafer breaking method according to any one of the above embodiments; and
performing a failure analysis on the cross section of the abnormal chip region.

BRIEF DESCRIPTION OF THE DRAWINGS

To describe the technical solutions in the embodiments of the present disclosure or in the related art more clearly, the following briefly describes the drawings required for describing the embodiments or the related art. Apparently, the drawings in the following description show merely some embodiments of the present disclosure, and those of ordinary skill in the art may still derive other drawings from these drawings without creative efforts.

DETAILED DESCRIPTION

Figure 1:
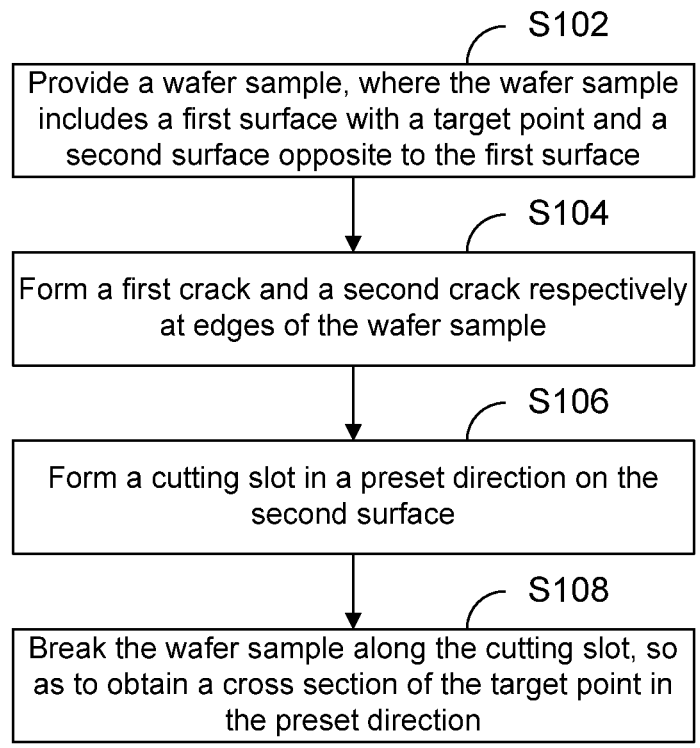
FIG. 1 is a schematic flowchart of a wafer breaking method according to an embodiment of the present disclosure.

To facilitate the understanding of the present disclosure, the embodiments of the present disclosure are described more comprehensively below with reference to the drawings. The preferred embodiments of the present disclosure are shown in the drawings. However, the present disclosure may be embodied in various forms without being limited to the embodiments described herein. On the contrary, these embodiments are provided to make the present disclosure more thorough and comprehensive.

Unless otherwise defined, all technical and scientific terms used herein have the same meaning as commonly understood by those skilled in the technical field of the present disclosure. The terms mentioned herein are merely for the purpose of describing specific embodiments, rather than to limit the present disclosure. The term "and/or" used herein includes any and all combinations of one or more of the associated listed items.

It should be noted that in the description of the embodiments of the present disclosure, the terms such as "top", "bottom", "vertical", "horizontal", "inner" and "outer" indicate the orientation or position relationships based on the drawings. These terms are merely intended to facilitate description of the embodiments of the present disclosure and simplify the description, rather than to indicate or imply that the mentioned device or element must have a specific orientation and must be constructed and operated in a specific orientation. Therefore, these terms should not be construed as a limitation to the embodiments of the present disclosure.

It is understandable that the terms such as "first" and "second" used herein may be used to describe various elements, but these elements are not limited by these terms. Instead, these terms are merely intended to distinguish one element from another. For example, without departing from the scope of the present disclosure, a first crack may be referred to as a second crack, and similarly, a second crack may be referred to as a first crack. The first crack and the second crack both are cracks formed on a wafer sample, but they are not the same crack.

Moreover, the terms such as "first" and "second" are used only for the purpose of description and should not be construed as indicating or implying a relative importance, or implicitly indicating a quantity of indicated technical features. Therefore, features defined by "first" and "second" may explicitly or implicitly include at least one of the features. In the description of the present disclosure, "multiple" means two or more, such as two or three, unless otherwise specifically defined. In description of the present disclosure, "several" means at least one, such as one or two, unless otherwise specifically defined.

Wafers with a wafer notch perpendicular or parallel to a crystal direction thereof are called Type I wafers, and wafers with a wafer notch at other angles to a crystal direction thereof are called Type II wafers. A product line direction on a Type I wafer is parallel or perpendicular to a crystal direction (preferred breakage direction) of the wafer. By slightly scratching the surface of a wafer edge near a target with a diamond/tungsten carbide tipped scriber and breaking the wafer directly with both hands, a breakage plane is neatly broken along the preferred breakage direction (100) of the wafer. Microscopic analysis of physical properties of the wafer may be performed directly through the breakage plane. The product line direction and crystal direction of a Type II wafer are at a preset angle greater than 0° and less than 90°. The breakage plane of the wafer is neatly broken in the preferred breakage direction. However, it also has a preset angle with the product line direction, so it is impossible to directly conduct microscopic analysis of the physical properties of the wafer through the breakage plane. Taking a preset angle of 45° as an example, after the wafer is rotated by 45°, the wafer notch is defined to obtain a wafer with a preferred breakage direction (110). The product line direction of the wafer forms an angle of 45° with the preferred breakage direction, and the natural breakage plane obtained by slicing the wafer will form an angle of 45° with the product line direction. Therefore, it is not possible to perform microscopic analysis of physical properties of the product line at the position of the breakage plane directly through the breakage plane.

FIG. 1 is a schematic flowchart of a wafer breaking method according to an embodiment of the present disclosure. As shown in FIG. 1, in the present disclosure, the wafer breaking method includes:

S102: Provide a wafer sample, where the wafer sample includes a first surface with a target point and a second surface opposite to the first surface.

Specifically, the wafer sample is composed of a substrate and a device layer formed on the substrate. A surface of the substrate on which the device layer is formed is the first surface of the wafer sample, and the other surface of the substrate opposite to the first surface is the second surface. The target point is a pattern on the wafer that needs to be cross-sectionally analyzed, such as a pattern to be analyzed for a failure. The target point may be any pattern used to make a semiconductor device, such as circle, rectangle, triangle, etc. The substrate may be made of undoped monocrystalline silicon, doped monocrystalline silicon, silicon-on-insulator (SOI), stacked silicon-on-insulator (SSOI), stacked silicon-germanium-on-insulator (S—SiGeOI), silicon-germanium-on-insulator (SiGeOI), and germanium-on-insulator (GeOI), etc. As an example, in this embodiment, the substrate is made of monocrystalline silicon.

S104: Form a first crack and a second crack respectively at edges of the wafer sample.

The position of the target point is found on the wafer sample, and then the first crack and the second crack are respectively formed on the edges of the wafer sample. Orthographic projection of the first crack and the second crack on the first surface are on the same straight line as the target point in a preset direction. The preset direction refers to a preset section direction of the target point to be observed, that is, a breakage direction of the wafer sample to be obtained. For example, the preset direction is the same as a product line direction where the target point is located.

S106: Form a cutting slot in a preset direction on the second surface.

A cutting slot in the preset direction is formed on the second surface of the wafer with the first crack and second crack as alignment points. There is a preset distance between a bottom of the cutting slot and the first surface. That is, a depth of the cutting slot is less than a thickness of the wafer sample. The preset distance refers to a cutting depth to break the wafer sample along the cutting slot without affecting a cross section of the target point. Orthographic projection of the first crack and the second crack on the second surface are on the same straight line as the cutting slot.

S108: Break the wafer sample along the cutting slot to obtain the cross section of the target point in the preset direction.

Specifically, the wafer sample is broken along the cutting slot on the second surface, such that the wafer sample is broken in the preset direction, and the cross section of the target point in the preset direction is obtained. This design prevents the crystal direction of the substrate of the wafer sample from affecting on the breakage direction.

The wafer breaking method includes: provide a wafer sample, where the wafer sample includes a first surface with a target point and a second surface opposite to the first surface; form a first crack and a second crack respectively at edges of the wafer sample, where orthographic projection of the first crack and the second crack on the first surface are on the same straight line as the target point in a preset direction; form a cutting slot in the preset direction on the second surface, where there is a preset distance between a bottom of the cutting slot and the first surface, and orthographic projection of the first crack and the second crack on the second surface are on the same straight line as the cutting slot; and break the wafer sample along the cutting slot, such that the wafer sample is broken in the preset direction, so as to obtain a cross section of the target point in the preset direction. The method can accurately obtain the cross section of the target point in the preset direction without being affected by the angle between the crystal direction of the wafer and the preset direction.

Figure 2:
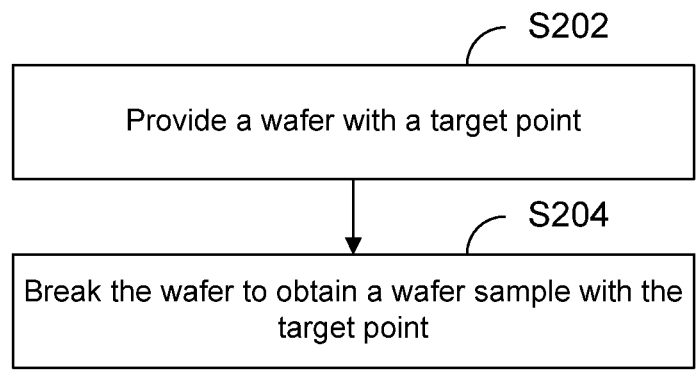
FIG. 2 is a schematic flowchart of providing a wafer sample according to an embodiment of the present disclosure.
Figure 3:
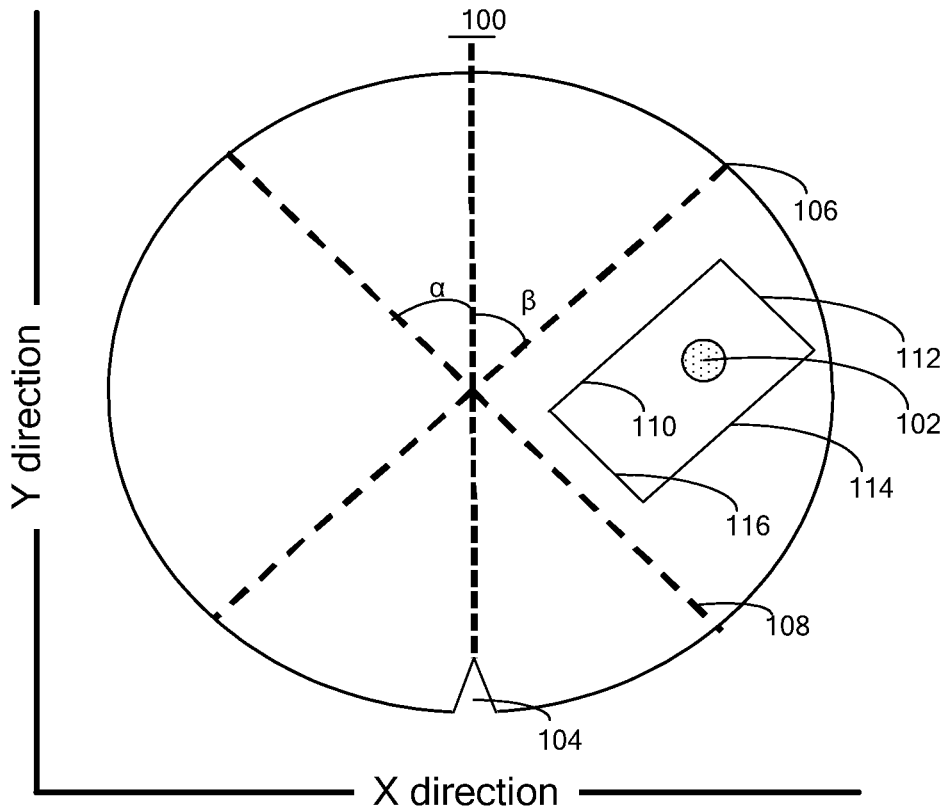
FIG. 3 is a schematic top view of a wafer with a target point according to an embodiment of the present disclosure.
Figure 4:
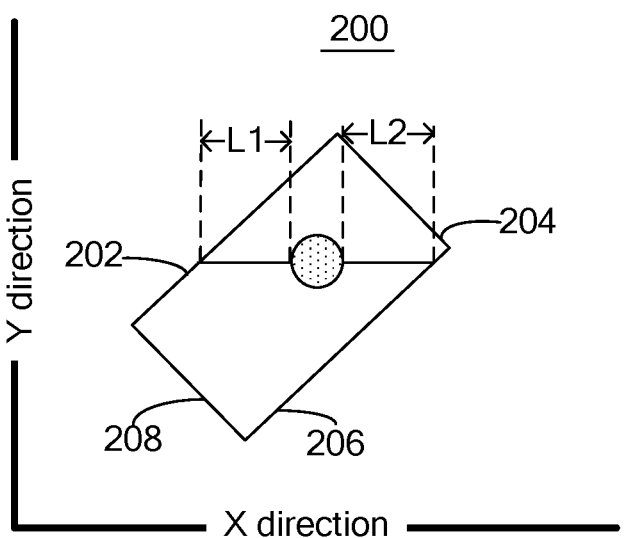
FIG. 4 is a schematic top view of the wafer sample, shown in FIG. 3, according to an embodiment of the present disclosure.

FIG. 2 is a schematic flowchart of providing a wafer sample according to an embodiment of the present disclosure. FIG. 3 is a schematic top view of a wafer with a target point according to an embodiment of the present disclosure. FIG. 4 is a schematic top view of the wafer sample, shown in FIG. 3, according to an embodiment of the present disclosure. As shown in FIG. 2, FIG. 3, and FIG. 4, in an embodiment, the step of providing a wafer sample includes:

S202: Provide a wafer with a target point.

As shown in FIG. 3, a wafer 100 with a target point 102 is provided. A certain angle is formed between a wafer notch 104 of the wafer 100 and a crystal direction of the wafer 100. The wafer notch 104 extends along a Y direction, and a preset direction of the target point is an X direction perpendicular to the Y direction. A preferred breakage direction of the wafer 100 includes a first breakage direction 106 perpendicular to the crystal direction and a second breakage direction 108 parallel to the crystal direction. A direction of the wafer notch 104 forms an angle β with the first breakage direction 106, and the direction of the wafer notch 104 forms an angle α with the second breakage direction 108, α+β=90°.

In an embodiment, an angle between the preset direction and the crystal direction of the wafer sample is greater than 0° and less than 90°, that is, β is greater than 0° and less than 90°, such as 30°, 45° and 60°.

S204: Break the wafer to obtain a wafer sample with the target point.

Referring to FIGS. 3 and 4, before the wafer is broken, the wafer 100 is placed under an optical microscope to determine a position of the target point 102 on the wafer 100, and the position of the target point 102 is marked on the wafer 100. The target point 102 may be circled with a marker so as to quickly find the target point 102 in a subsequent step. Then, lines are drawn along the first breakage direction 106 and the second breakage direction 108 around the target point 102 to obtain a first marking line 110, a second marking line 112, a third marking line 114 and a fourth marking line 116. The first marking line 110 and the third marking line 114 are parallel to the first breakage direction 106, and the second marking line 112 and the fourth marking line 116 are parallel to the second breakage direction 108. The wafer 100 is broken along the first marking line 110, the second marking line 112, the third marking line 114 and the fourth marking line 116 with a diamond/tungsten carbide tipped scriber to obtain a large test piece including the target point 102 as a wafer sample 200. A first side 202 of the wafer sample 200 is obtained along the first marking line 110. A second side 204 of the wafer sample 200 is obtained along the second marking line 112. A third side 206 of the wafer sample 200 is obtained along the third marking line 114. A fourth side 208 of the wafer sample 200 is obtained along the fourth marking line 116. In order to facilitate subsequent breaking of the wafer sample 200 along the cutting slot, in the X direction, a distance L1 between the target point 102 and the first side 202 is equal to a distance L2 between the target point 102 and the third side 206.

In an embodiment, the forming a first crack and a second crack respectively on edges of the wafer sample 200 includes: form the first crack and the second crack extending toward the target point on the first surface, where the first crack and the second crack at least partially penetrate the wafer sample 200. The first crack and the second crack that at least partially penetrate the wafer sample 200 may be used as alignment points for subsequent formation of the cutting slot on the second surface, thereby improving the breaking accuracy.

In an embodiment, the first crack and the second crack completely penetrate the wafer sample 200.

In an embodiment, the forming the first crack and the second crack extending toward the target point on the first surface includes: form, by a first cutting device, the first crack and the second crack in the preset direction on two opposite sides of the target point. The forming the cutting slot in the preset direction on the second surface includes: form, by a second cutting device, the cutting slot on the second surface with the first crack and the second crack as endpoints.

Figure 5:
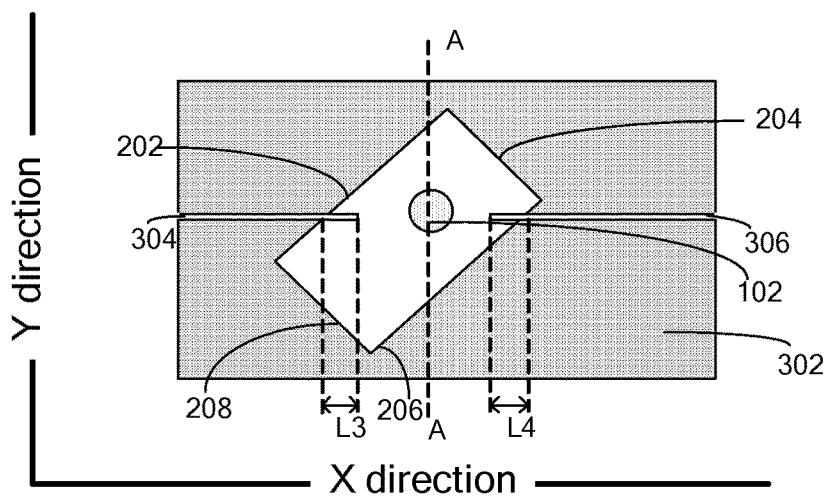
FIG. 5 is a schematic top view of a wafer sample after a first crack and a second crack are formed according to an embodiment of the present disclosure.
Figure 6:
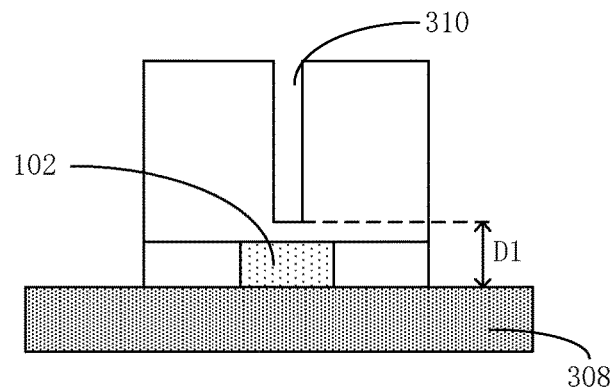
FIG. 6 is a schematic sectional view of the wafer sample, shown in FIG. 5, along AA after a cutting slot is formed according to an embodiment of the present disclosure.

FIG. 5 is a schematic top view of a wafer sample after a first crack and a second crack are formed according to an embodiment of the present disclosure. FIG. 6 is a schematic sectional view of the wafer sample, shown in FIG. 5, along AA after a cutting slot is formed according to an embodiment of the present disclosure. As shown in FIG. 5, the second surface of the wafer sample 200 is attached to a first adhesive film 302 corresponding to the first cutting device that is able to precisely control the cutting position and cutting depth. Then, in the preset direction, the first adhesive film 302 near the wafer sample 200 is cut to the first side 202 of the target point 102 to form a first crack 304 at an edge of the wafer sample 200. Meanwhile, the first adhesive film 302 near the wafer sample 200 is cut to the third side 206 of the target point 102 to form a second crack 306 at an edge of the wafer sample 200. As shown in FIG. 6, the first adhesive film 302 on the second surface of the wafer sample 200 is removed. The first surface of the wafer sample 200 is attached to a second adhesive film 308 corresponding to the second cutting device that is able to precisely control the cutting position and cutting depth. With the first crack 304 and the second crack 306 as alignment points, the second surface of the wafer sample 200 is cut to form a cutting slot 310 in the preset direction. There is a preset distance D1 between a bottom of the cutting slot 310 and the first surface. Without affecting the cross section of the target point, a smaller preset distance D1 leads to a better breaking effect, making it easier to obtain an accurate cross section.

In an embodiment, along the Y direction, the cutting slot 310 is narrower than the first crack 304, and the cutting slot 310 is narrower than the second crack 306. Therefore, the accuracy of the cross section of the target point can be controlled by controlling the accuracy of the cutting slot 310.

In an embodiment, along the Y direction, the cutting slot 310 is wider than the first crack 304, and the cutting slot 310 is wider than the second crack 306. Therefore, the accuracy of the cross section of the target point can be controlled by controlling the accuracy of the first crack 304 and the second crack 306.

In an embodiment, the first crack 304 defines an initial breakage direction. In the Y direction, the first crack 304 is narrower than the second crack 306. The breakage direction can be shrunk to obtain an accurate cross section.

In an embodiment, the first adhesive film 302 is 100 μm thick. In other embodiments, the first adhesive film 302 with different thicknesses can be selected as required, as long as the thickness of the first adhesive film 302 does not affect the performance of the first crack 304 and the second crack 306.

In an embodiment, the second adhesive film 308 is 100 μm thick. In other embodiments, the second adhesive film 308 with different thicknesses can be selected as required, as long as the thickness of the second adhesive film 308 does not affect the formation of the cutting slot.

In an embodiment, the second adhesive film 308 and the first adhesive film 302 are the same adhesive film. In another embodiment, the second adhesive film 308 and the first adhesive film 302 are different adhesive films.

In an embodiment, a length L3 of the first crack 304 in the preset direction is the first preset length, and a length L4 of the second crack 306 in the preset direction is the second preset length.

In an embodiment, the first preset length and the second preset length have preset values, such as 1 mm and 2 mm. Under the condition that the first crack 304 and the second crack 306 do not affect the cross section of the target point 102 in the preset direction, the values of the first preset length and the second preset length may be set according to actual needs.

In an embodiment, in the preset direction, a distance between the target point 102 and the first crack 304 is equal to that between the target point 102 and the second crack 306. This design can improve the breaking accuracy.

In an embodiment, the first cutting device and the second cutting device are laser cutting devices. The wafer sample 200 is placed on the laser cutting device with a side without adhesive film facing up, and the parameters of the laser cutting device are set. The set parameters may include dot depth, energy and laser wavelength, etc. Exemplarily, when the first crack 304 and the second crack 306 are formed, the position of the target point 102 is found through a high-power microscope on the laser cutting device. Then, the width and level of each dot are adjusted. The direction of each dot is perpendicular to the edge of the wafer sample, thereby obtaining the first crack 304 and the second crack 306 in the preset direction. Exemplarily, multiple dots are made from near the target point 102 to the edges of the wafer sample 200 to form the first crack 304 and the second crack 306. The widths of the first crack 304 and the second crack 306 along the Y direction gradually increase from the target point 102 to the edges of the wafer sample 200. In this way, when the cutting slot is formed, the first crack 304 and the second crack 306 can be used as calibration points to ensure the accurate position of breaking, such that the wafer sample is broken along the straight line where the first crack 304 and the second crack 306 are located.

In an embodiment, a ratio of the preset distance to the thickness of the wafer sample is less than 1 and not less than 0.1, such as 0.2, 0.3, 0.4, 0.5, 0.7 and 0.9. Exemplarily, the wafer sample 200 is 780 μm thick, and the cutting slot is 680 μm deep, that is, the preset distance is 100 μm. Thus, after the wafer sample is removed from the second adhesive film 308, the wafer sample 200 may be self-broken along the cutting slot 310 on the second surface by a little external force, so as to obtain a breakage plane with a breakage direction in the preset direction, without being affected by the crystal direction of the wafer sample. Compared with a conventional method such as grinding or ion beam cutting to obtain the cross section of the target point 102 in the preset direction, the method of the present disclosure for obtaining the breakage plane of the target point has low cost and short time.

Figure 7:
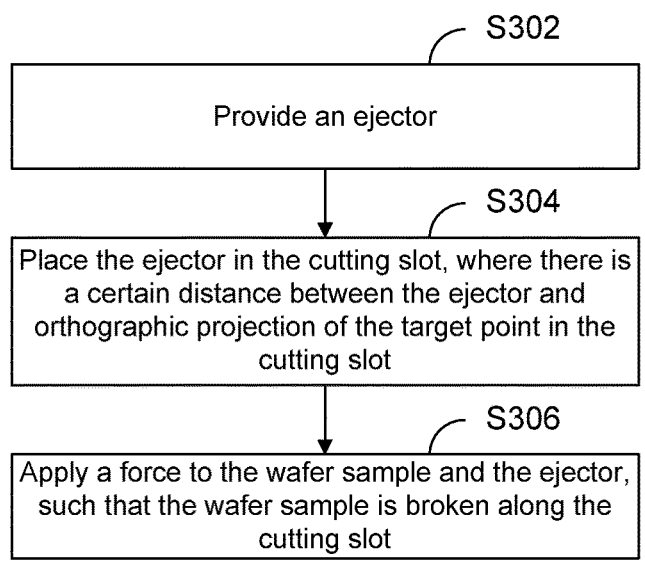
FIG. 7 is a schematic flowchart of breaking a wafer sample along a cutting slot according to an embodiment of the present disclosure.

FIG. 7 is a schematic flowchart of breaking a wafer sample along a cutting slot according to an embodiment of the present disclosure. As shown in FIG. 7, in an embodiment, the step of breaking the wafer sample along the cutting slot includes:

S302: Provide an ejector.

S304: Place the ejector in the cutting slot, where there is a certain distance between the ejector and orthographic projection of the target point in the cutting slot.

S306: Apply a force to the wafer sample and the ejector, such that the wafer sample is broken along the cutting slot.

Specifically, an ejector is provided, which may be placed vertically under an optical microscope. Then, the wafer sample 200 is placed over the ejector with the surface where the target point 102 is located facing up. The ejector is placed close to the target point and aligned with the cutting slot 310. There is a certain distance between the ejector and the orthographic projection of the target point in the cutting slot. Preferably, the ejector is aligned with a position of the cutting slot 310 close to the edges of the wafer sample 200. Since the cutting slot 310 is very deep, it is convenient for the ejector to apply the force, thereby improving the breaking effect.

In embodiment, the length of the target point 102 is not less than 10 μm and not more than 1 mm, that is, the target point 102 is in the order of microns.

It should be understood that although the steps in the flowchart of FIG. 1 are sequentially displayed according to the arrows, these steps are not necessarily executed in the order indicated by the arrows. Unless clearly described otherwise, the execution order of the steps is not strictly limited, and these steps may be executed in other orders. Moreover, at least some of the steps in FIG. 1 may include a plurality of sub-steps or stages. The sub-steps or stages are not necessarily executed at the same time, but may be executed at different times. The execution order of the sub-steps or stages is not necessarily carried out sequentially, but may be executed alternately with other steps or at least some of the sub-steps or stages of other steps.

Figure 8:
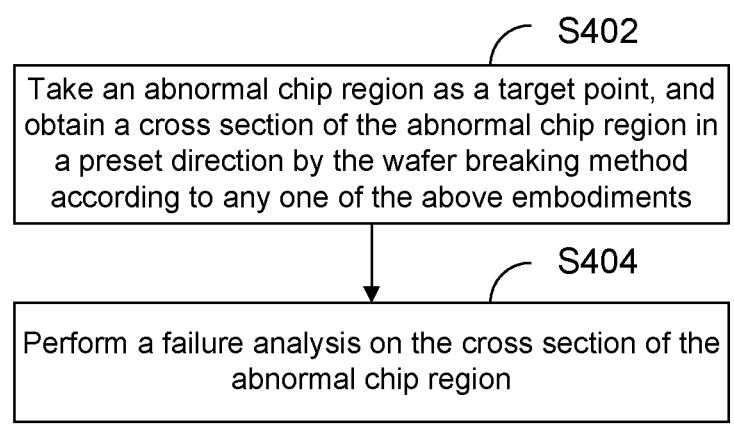
FIG. 8 is a schematic flowchart of a chip failure analysis method according to an embodiment of the present disclosure.

FIG. 8 is a schematic flowchart of a chip failure analysis method according to an embodiment of the present disclosure. As shown in FIG. 8, the disclosure also provides a method for chip failure analysis, including: S402: Take an abnormal chip region as a target point, and obtain a cross section of the abnormal chip region in a preset direction by the wafer breaking method according to any one of the above embodiments.

S404: Perform a failure analysis on the cross section of the abnormal chip region.

The chip failure analysis method includes: provide a wafer sample, where the wafer sample includes a first surface with an abnormal chip region and a second surface opposite to the first surface; form a first crack and a second crack respectively at edges of the wafer sample, where orthographic projection of the first crack and the second crack on the first surface are on the same straight line as the abnormal chip region in a preset direction; form a cutting slot in the preset direction on the second surface, where there is a preset distance between a bottom of the cutting slot and the first surface, and orthographic projection of the first crack and the second crack on the second surface are on the same straight line as the cutting slot; and break the wafer sample along the cutting slot, such that the wafer sample is broken in the preset direction, so as to obtain a cross section of the abnormal chip region in the preset direction. The method can accurately obtain the cross section of the abnormal chip region in the preset direction without being affected by the angle between the crystal direction of the wafer and the preset direction.

The present disclosure further provides a computer device. The computer device includes a memory and a processor, where the memory stores a computer program, and the computer program is executed by the processor to implement the steps of the wafer breaking method according to any one of the above embodiments.

The present disclosure further provides a computer device. The computer device includes a memory and a processor, where the memory stores a computer program, and the computer program is executed by the processor to implement the steps of the chip failure analysis method according to any one of the above embodiments.

The technical features of the above embodiments can be employed in arbitrary combinations. To provide a concise description of these embodiments, all possible combinations of all technical features of the embodiments may not be described. However, these combinations of technical features should be construed as disclosed in the description as long as no contradiction occurs.

The above described are merely several embodiments of the present disclosure. Although these embodiments are described specifically and in detail, they should not be construed as a limitation to the patent scope of the present disclosure. It should be noted that those of ordinary skill in the art may further make variations and improvements without departing from the conception of the embodiments of the present disclosure. These variations and improvements should fall within the protection scope of the embodiments of the present disclosure. Therefore, the protection scope of the embodiments of the present disclosure should be subject to the protection scope defined by the attached claims.

The invention claimed is:

1. A wafer breaking method, comprising:
   providing a wafer sample, wherein the wafer sample comprises a first surface with a target point and a second surface opposite to the first surface;
   forming a first crack and a second crack respectively at edges of the wafer sample, wherein orthographic projection of the first crack and the second crack on the first surface are on the same straight line as the target point in a preset direction;
   forming a cutting slot in the preset direction on the second surface, wherein there is a preset distance between a bottom of the cutting slot and the first surface, and orthographic projection of the first crack and the second crack on the second surface are on the same straight line as the cutting slot; and
   breaking the wafer sample along the cutting slot, such that the wafer sample is broken in the preset direction, so as to obtain a cross section of the target point in the preset direction.

2. The method according to claim 1, wherein the forming a first crack and a second crack respectively at edges of the wafer sample comprises:
   forming the first crack and the second crack extending toward the target point on the first surface, wherein the first crack and the second crack at least partially penetrate the wafer sample.

3. The method according to claim 2, wherein the forming the first crack and the second crack extending toward the target point on the first surface comprises:
   forming, by a first cutting device, the first crack and the second crack in the preset direction on two opposite sides of the target point; and
   the forming a cutting slot in the preset direction on the second surface comprises:
   forming, by a second cutting device, the cutting slot on the second surface with the first crack and the second crack as endpoints.

4. The method according to claim 3, wherein the first cutting device and the second cutting device are laser cutting devices.

5. The method according to claim 1, wherein lengths of the first crack and the second crack in the preset direction define a first preset length and a second preset length, respectively.

6. The method according to claim 5, wherein the first preset length and the second preset length have preset values.

7. The method according to claim 1, wherein in the preset direction, a distance between the target point and the first crack is equal to a distance between the target point and the second crack.

8. The method according to claim 1, wherein a ratio of the preset distance to a thickness of the wafer sample is less than 1 and not less than 0.1.

9. The method according to claim 1, wherein an angle between the preset direction and a crystal direction of the wafer sample is greater than 0° and less than 90°.

10. The method according to claim 1, wherein the breaking the wafer sample along the cutting slot comprises:
    providing an ejector;
    placing the ejector in the cutting slot, wherein there is a certain distance between the ejector and orthographic projection of the target point in the cutting slot; and
    applying a force to the wafer sample and the ejector, such that the wafer sample is broken along the cutting slot.

11. The method according to claim 1, wherein the providing a wafer sample comprises:
    providing a wafer with the target point; and
    breaking the wafer to obtain a wafer sample with the target point.

12. The method according to claim 1, wherein the target point has a length of not less than 10 μm.

13. A chip failure analysis method, comprising:
    taking an abnormal chip region as a target point, and obtaining a cross section of the abnormal chip region in a preset direction by the wafer breaking method according to claim 1; and
    performing a failure analysis on the cross section of the abnormal chip region.

\* \* \* \* \*